United States Patent
Imai et al.

(10) Patent No.: US 6,784,368 B2
(45) Date of Patent: Aug. 31, 2004

(54) SHIELD CONNECTION STRUCTURE OF CABLE

(75) Inventors: Takashi Imai, Okazaki (JP); Junzo Ooe, Aichi-ken (JP); Hiroshi Kobayashi, Okazaki (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/149,671

(22) PCT Filed: Apr. 18, 2001

(86) PCT No.: PCT/JP01/03325

§ 371 (c)(1),
(2), (4) Date: Jun. 13, 2002

(87) PCT Pub. No.: WO01/80392

PCT Pub. Date: Oct. 25, 2001

(65) Prior Publication Data

US 2004/0011550 A1 Jan. 22, 2004

(30) Foreign Application Priority Data

Apr. 19, 2000 (JP) ........................................ 2000-118019

(51) Int. Cl.$^7$ ............................................... H01B 7/34
(52) U.S. Cl. ..................................... 174/74 R; 174/78
(58) Field of Search ............................. 174/74 R, 75 C, 174/77 R, 78, 79, 84 R, 55 C, 42, 50.52, 50.59, 60, 61, 62, 63, 64, 65 R, 84 C, 99 R

(56) References Cited

U.S. PATENT DOCUMENTS

| | | | | |
|---|---|---|---|---|
| 2,142,884 A | * | 1/1939 | Chaplin ..................... 174/21 R |
| 3,142,721 A | * | 7/1964 | Long ......................... 174/65 R |
| 3,830,955 A | * | 8/1974 | Double ....................... 174/65 R |
| 5,417,587 A | * | 5/1995 | Katsuda et al. ............. 439/559 |
| 5,691,506 A | * | 11/1997 | Miyazaki et al. .......... 174/65 R |
| 5,912,433 A | | 6/1999 | Pulido et al. .............. 174/77 R |
| 6,042,396 A | * | 3/2000 | Endo et al. ................ 439/98 |
| 6,143,987 A | * | 11/2000 | Makita ....................... 174/74 R |
| 6,186,802 B1 | * | 2/2001 | Masuda et al. ............. 439/98 |
| 6,262,374 B1 | * | 7/2001 | Matsumoto et al. ........ 174/74 R |
| 6,280,208 B1 | * | 8/2001 | Masuda et al. ............. 439/98 |
| 6,296,519 B1 | * | 10/2001 | Hashizawa et al. ........ 439/607 |
| 6,328,579 B1 | * | 12/2001 | Mori et al. ................. 439/97 |
| 6,358,069 B2 | * | 3/2002 | Yoshioka et al. .......... 439/108 |

FOREIGN PATENT DOCUMENTS

| | | | |
|---|---|---|---|
| EP | 0 963 147 A2 * | 12/1999 | .......... H05K/9/00 |
| JP | 01-148013 A * | 5/1989 | .......... H02G/15/02 |
| JP | 07-045129 | 2/1995 | |
| JP | 09-161892 | 6/1997 | |
| JP | 09182243 | 7/1997 | |
| JP | 09-182243 A * | 7/1997 | .......... H02G/3/06 |
| JP | 10-112958 | 4/1998 | |
| JP | 11-025749 | 1/1999 | |
| JP | 11-262153 | 9/1999 | |
| JP | 11-262153 A * | 9/1999 | .......... H02G/15/02 |

OTHER PUBLICATIONS

James F. Shackelford et al , Materials Science and Engineering Handbook, 3rd Edition, Jan. 2001, p. 948.*
Notification Of Transmittal Of Copies Of Translation Of The International Preliminary Examination Report (mailed Jan. 29, 2003) and English translation of the International Preliminary Examination Report.

* cited by examiner

Primary Examiner—William H. Mayo, III
(74) Attorney, Agent, or Firm—Kenyon & Kenyon

(57) ABSTRACT

A shield connection structure for shielding electromagnetic noise for a long time with a simple structure. A shielded cable is located through a cylindrical part of a shield terminal formed of a material having a small conductive resistance. The cylindrical part of the shield terminal is held in contact with a shield braid of the coaxial cable by a caulking layer between the shield braid and the cable core, and a flange part of the shield terminal is fixed via a low-resistance joint, such as a bolt, to a metallic housing. Use of relatively rigid caulking and the low-resistance joint provides a vibration-resistant shielded connection structure suitable for long-lived use in an applications such as a connection for an electric motor in a vehicle.

16 Claims, 4 Drawing Sheets

SHIELD CONNECTION STRUCTURE OF CABLE

TECHNICAL FIELD

The present invention relates to a shield connection structure for a cable, and in particular to a shield connection structure for connecting a shield member of a cable for shielding electromagnetic noise to a metallic cabinet.

BACKGROUND ART

In typical conventional shield connection structures, a socket is connected to an end of a shield member of a cable in such a way that the cable is connectable to a metallic cabinet or the like via the socket (disclosed, for example, in Japanese Patent Laid-open Publication No. Hei 11-25749). In such a shield connection structure, the socket is soldered to the end of the shield member. Because this shield connection structure prevents the cable from detaching from the metallic cabinet even when the cable swings due to vibration of the vehicle, this structure is regarded as good shielding of electromagnetic noise.

In this shield connection structure using a socket, however, requirement of soldering makes fixing of the socket to an end of the shield member more difficult or troublesome, and the complexity of the socket structure leads to increased cost. Moreover, in this structure, because contact resistance between the shield member and the metallic cabinet is not considered, sometimes, shielding of electromagnetic noise is insufficient, or sometimes, shielding effect deteriorates over long-term use.

DISCLOSURE OF INVENTION

One object of a shield connection structure of the present invention is to achieve more reliable shielding of electromagnetic noise. Another object of the shield connection structure of the present invention is to achieve a simple structure. Still another object of the shield connection structure of the present invention is to achieve sufficient shielding of electromagnetic noise even over a long-term use.

In order to achieve at least one of the above mentioned objects, the cable shield connection structure of the present invention employs the following means.

A cable shield connection structure according to the present invention is a shield connection structure for connecting a shield member of a cable for shielding electromagnetic noise to a metallic cabinet, and comprises a terminal made from material of small electric conductive resistance and connectable to the shield member; and a fixing member for fixing the terminal to the metallic cabinet. In this structure, connection is made such that electric resistance between the shield member and the metallic cabinet is less than a predetermined value.

In this cable shield connection structure of the present invention, connection is made using a terminal which is made from a material having small electric conductive resistance and connectable to a shield member, and a fixing member for connecting the terminal to the metallic cabinet such that electric conductive resistance between the shield member and the metallic cabinet is less than a predetermined value. This arrangement can sufficiently shield electromagnetic noise using a simple structure. Here, "a predetermined value" may be 10 mΩ, preferably 1 mΩ. These values are based on the fact that electromagnetic noise shielding effect starts to arise approx. 10 mΩ, although this may depend on frequencies, and is more effective for 1 mΩ or less. Therefore, when electric resistance between the shield member and the metallic cabinet is set at 10 mΩ or less, electromagnetic noise shielding effect can be achieved. Moreover, when electric resistance between the shield member and the metallic cabinet is set at 1 mΩ or less, improved electromagnetic noise shielding effect can be achieved.

In this cable shield connection structure according to the present invention, the terminal preferably comprises a cylindrical part for being connected to the shield member and a flange for being fixed to the metallic cabinet. In this cable shield connection structure according to the present invention, connection between the cylindrical part of the terminal and the shield member is preferably effected by a caulking connection in which the shielding member is sandwiched between a caulking member and the cylindrical part. This arrangement can connect the shield member and the terminal and easily reduce contact resistance.

In the cable shield connection structure according to the present invention, the terminal is preferably subjected to a corrosion-proofing processing. This enables sufficient shielding of electromagnetic noise, even over long-term use.

Further, in the cable shield connection structure according to the present invention, the fixing member is preferably a member for fixing the terminal to the metallic cabinet in a removable manner. This allows easy maintenance of a device employing the metallic cabinet.

Still further, in the cable shield connection structure according to the present invention, the metallic cabinet is preferably a cabinet of a device to be mounted to a vehicle, including a motor, a generator, and a battery. In a vehicle, because electronics which are easily affected by electromagnetic noise are mounted in a limited space inside of the vehicle, shielding of electromagnetic noise results in a significant effect. Moreover, the cable shield connection structure according to the present invention has a simple structure yet exerts a sufficient connecting force, and therefore achieves sufficient shielding of electromagnetic noise despite vibration due to movement of a vehicle or operation of a vehicle driving device, and continues sufficient shielding over long term use.

BEST MODE FOR CARRYING OUT THE INVENTION

Figure 1:
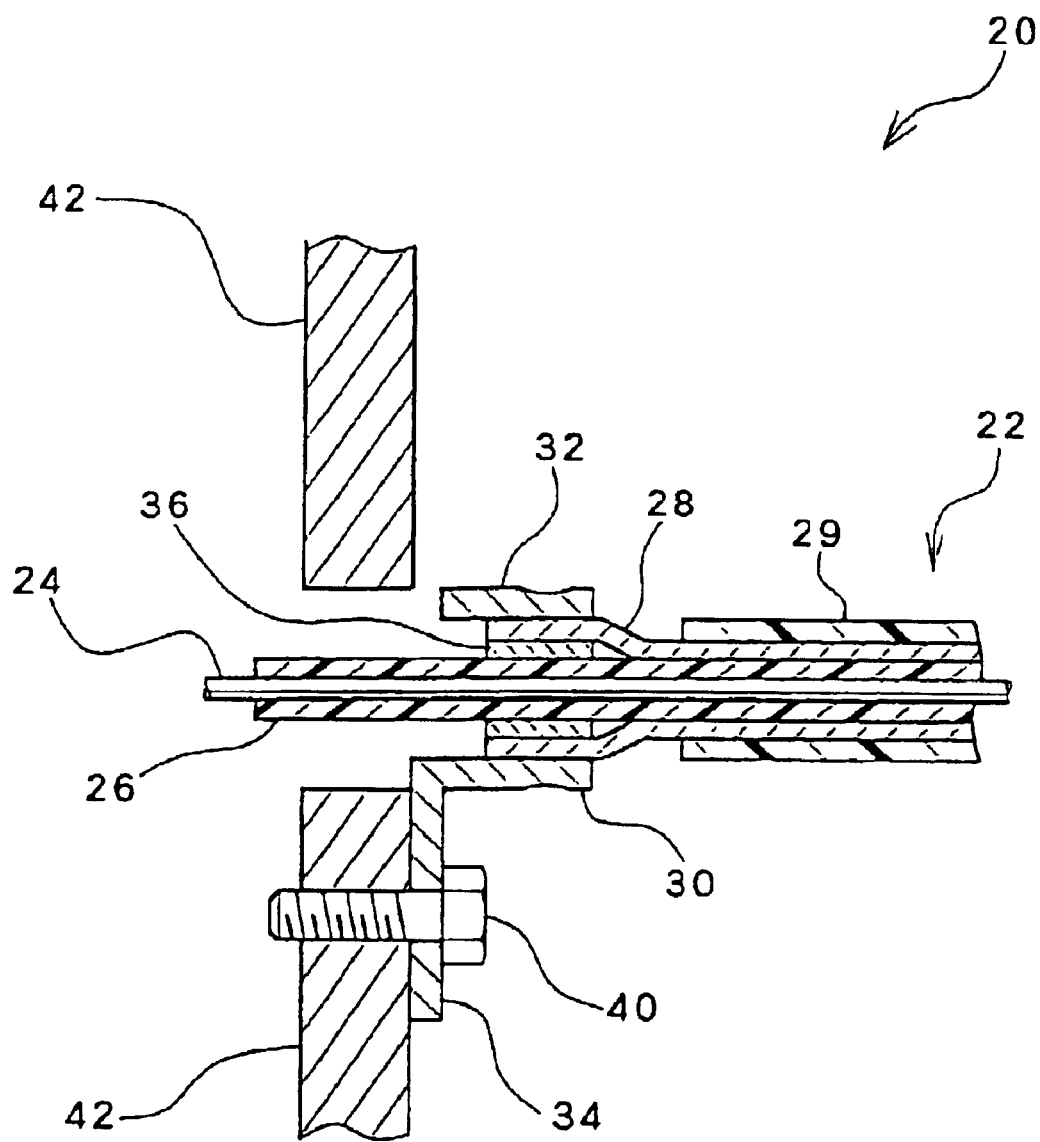
FIG. 1 is a schematic diagram showing a shield connection structure 20 according to an embodiment of the present invention.

In the following, an embodiment of the present invention will be described. FIG. 1 is a schematic diagram showing a shield connection structure 20 for a cable employed in an embodiment of the present invention. As shown, the shield connection structure 20 for a cable used in this embodiment comprises a shield terminal 30 connected to an end of a shield braid 28 of a coaxial line 22 for shielding electromagnetic noise, and a bolt 40 serving as a fixing member for fixing the shield terminal 30 to a metallic cabinet 42, such as of a vehicle-mounted motor or the like.

The coaxial line 22 comprises a power supplying core line 24, an insulating layer 26 covering the power supplying core line 24, a shield braid 28 made of braided copper wires for shielding electromagnetic noises propagating from the power supplying core line 24 to the outside, and an insulating layer 29 covering the shield braid 28.

The shield terminal 30 is made from material having small electric conductive resistance (such as a metal, for example, aluminum) and comprises a cylindrical part 32 for connecting with the shield braid 28, and a flange 34 for being fixed to the metallic cabinet 42 via a bolt 40. The surface of the shield terminal 30 is treated with corrosion-proofing processing (for example, tin plating) using material having small electric conductive resistance to be capable for a long-term use.

The cylindrical part 32 of the shield terminal 30 is connected to the shield braid 28 with a caulking connection in which the shield braid 28 is sandwiched between a shield sleeve 36 made from material having small electric conductive resistance and the cylindrical part 32. In such caulking connection technology, by ensuring that the caulking is sufficiently rigid, contact resistance between the cylindrical part 32 and the shield braid 28 can be sufficiently reduced, and this sufficiently reduced contact resistance can be maintained over long term use. Moreover, the sufficiently reduced contact resistance can even be maintained despite long-term exposure to vibration caused by motion of the vehicle or operation of a vehicle driving device, for example, a vehicle-mounted motor.

The flange 34 of the shield terminal 30 is fixed to the metallic cabinet 42 using a bolt 40. When fixing using a bolt 40, contact resistance between the flange 34 and the metallic cabinet 42 can be sufficiently reduced by ensuring a sufficient connection force by the bolt 40, thereby enabling connection with sufficiently reduced contact resistance to be maintained over long-term use. Moreover, the sufficiently reduced contact resistance can even be maintained despite long-time exposure to vibration due to motion of the vehicle or operation of a vehicle driving device, for example, a vehicle-mounted motor.

Figure 2:
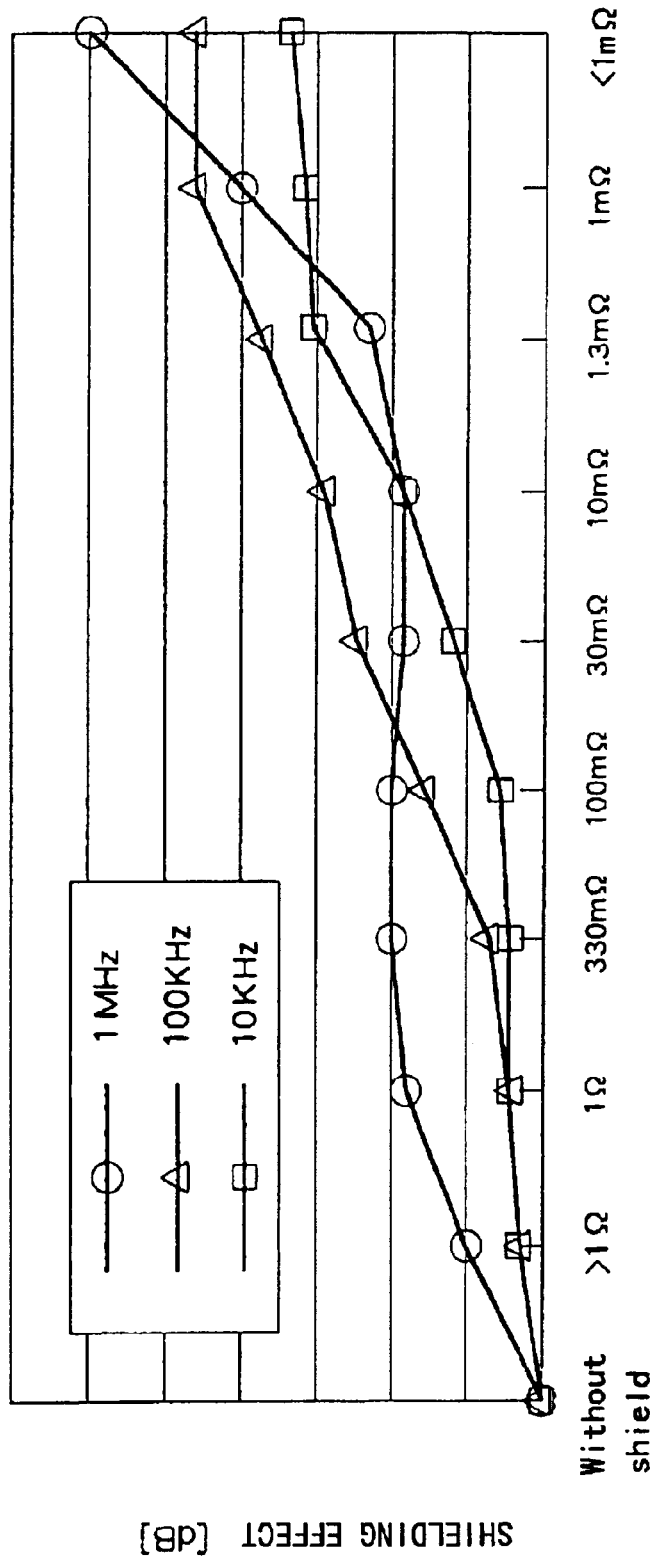
FIG. 2 is a graph showing an example of relationship between electromagnetic noise shielding effects and electric resistance between the shield braid 28 and the metallic cabinet 42.

FIG. 2 is a graph showing an example relationship between electromagnetic noise shielding effect and electric resistance between the shield braid 28 and the metallic cabinet 42. As shown, electromagnetic noise shielding effect starts to arise for electric resistance of approx. 10 mΩ between the shield braid 28 and the metallic cabinet 42, although such may depend on frequencies, and assumes a preferable value for electric resistance of 1 mΩ or less. That is, electromagnetic noise shielding effect can be achieved at any frequency when electric resistance is of 10 mΩ or less between the shield braid 28 and the metallic cabinet 42, and more preferable electromagnetic noise shielding effect can be achieved at any frequency for electric resistance of 1 mΩ or less.

In the present embodiment shield connection structure 20 for a cable; the shield terminal 30 is made from material having small electric conductive resistance, and an extent of caulking in connection between the shield braid 28 and the cylindrical part 32 of the shield terminal 30 and a connection force applied by the bolt 40 in fixing the cylindrical part 32 of the shield terminal 30 to the metallic cabinet 42 are both adjusted such that electric resistance between the shield braid 28 and the metallic cabinet 42 is to be no more than 10 mΩ, preferably 1 mΩ or less. As a result, sufficient electromagnetic noise shielding effect can be realized.

According to the above described embodiment of the cable shield connection structure 20, because electric resistance between the shield braid 28 and the metallic cabinet 42 is reduced to 10 mΩ or less, preferably 1 mΩ or less, electromagnetic noise can be sufficiently shielded. Moreover, because the surface of the shielding terminal 30 is treated with a corrosion-proofing processing, deterioration of contact resistance and electric conductive resistance over long-term use can be prevented. As a result, electromagnetic noise shielding effect can be maintained without deterioration over a long time.

Further, because the shielding terminal 30 is fixed to the metallic cabinet 42 using a bolt 40, maintenance or exchange of a device having the metallic cabinet 42 can be easily performed. Still further, because the fixing using a bolt 40 is simple in structure and can exert a sufficient connecting force despite long-term exposure to vibration caused by motion of the vehicle or operation of a vehicle driving device mounted in a vehicle electromagnetic noise in a vehicle can be sufficiently shielded for a long time.

Whereas the surface of the shield terminal 30 of the embodiment cable shield connection structure 20 is treated with a corrosion-proofing processing, such processing may be unnecessary when material having a corrosion resistant property and small electric conductive resistance is used, or for use under conditions where corrosion resistant property need not be considered.

Whereas caulking connection technology is employed to connect the shield braid 28 and the cylindrical part 32 of the shield terminal 30 in the cable shield connection structure 20 of the embodiment, any other suitable connection technology with small connection resistance may be employed. Also, whereas a bolt 40 is used in fixing the flange 34 of the shield terminal 30 to the metallic cabinet 42 in the cable shield connection structure 20, any other suitable fixing technology with small connection resistance may alternatively be used. In this case, not only removable fixing but also permanent fixing such as, for example, welding, soldering, and so forth, may be employed.

Although the shield terminal 30 of the cable shield connection structure 20 of the embodiment comprises a cylindrical part 32 and a flange 34, the shape of a connecting part of the shield terminal 30 for connection with the shield braid 28 is not limited to a cylindrical shape but may be of any other suitable shape. Likewise, the shape of a fixing part of the shield terminal 30 for fixing to the metallic cabinet 42 is not limited to a flange shape and may be any suitable shape.

Whereas the cable shield connection structure 20 in the embodiment is explained using an example in which it is connected to a metallic cabinet 42 of a vehicle-mounted motor or the like, the cable shield connection structure 20 may be connected to a metallic cabinet of a device mounted to any moving body other than a vehicle or of an installed-type device.

Figure 3:
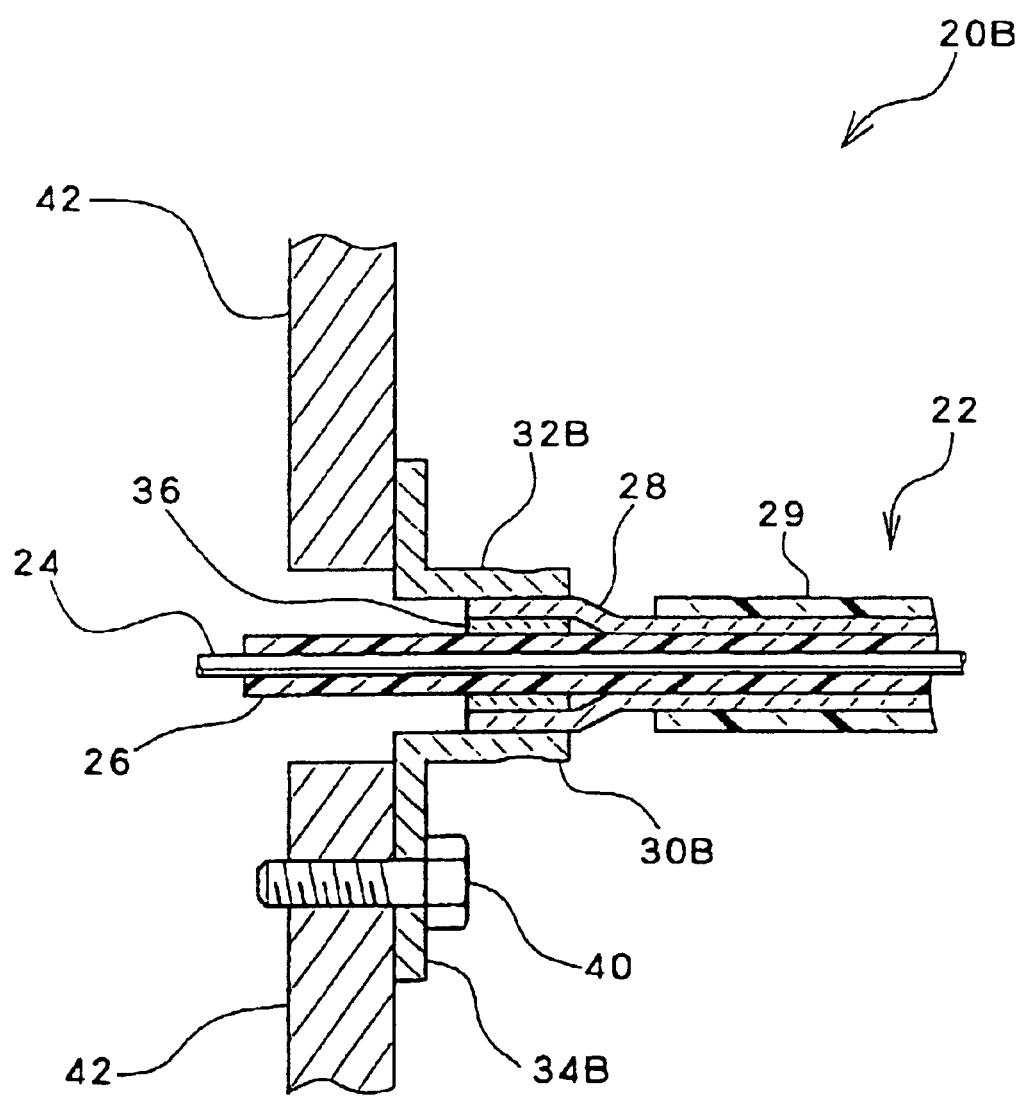
FIG. 3 is a schematic diagram showing a shield connection structure 20B for a cable according to another embodiment of the present invention.
Figure 4:
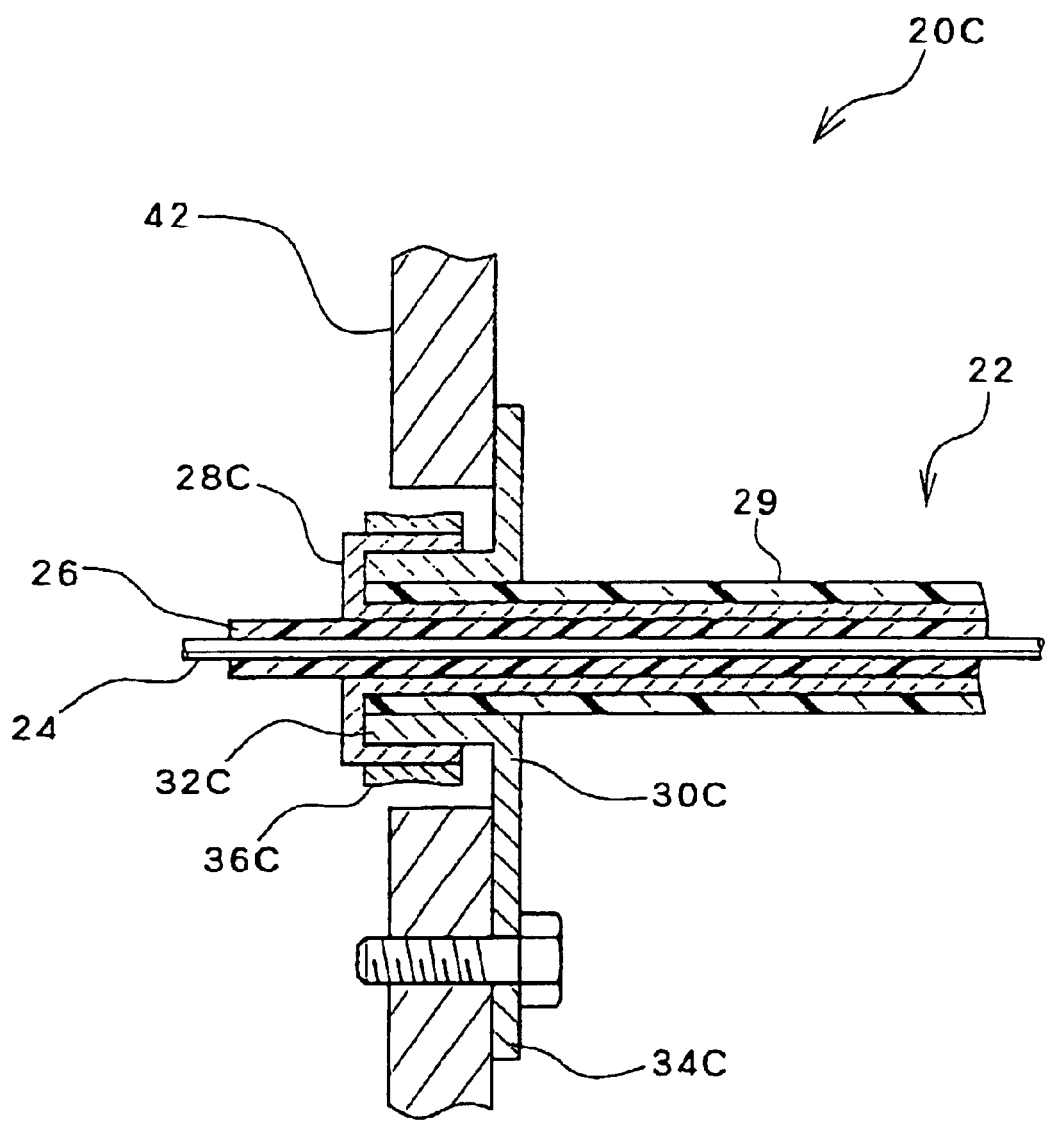
FIG. 4 is a schematic diagram showing a shield connection structure 20C for a cable according to still another embodiment of the present invention.

It should be noted that the cable shield connection structure 20 may be modified into a cable shield connection structure 20B of FIG. 3, a cable shield connection structure 20C of FIG. 4, or the like. In the modified cable shield connection structure 20B of FIG. 3, a flange 34B of the shield terminal 30B is provided so as to cover a throughout hole formed on the metallic cabinet 42. In the shield connection structure 20C of FIG. 4, the shield terminal 30C is positioned to cover the caulking connection part of the cylindrical portion 32C and the shield sleeve 36C inside of the metallic cabinet 42. A flange 34C of the shield terminal 30C is provided so as to cover a hole formed through the metallic cabinet 42. These types of shield connection structures can have water-proof property.

Although embodiments of the present invention have been described, the present invention is not limited to these embodiments and various modifications can be made within the scope of the present invention.

What is claimed is:

1. A shield connection structure for connecting a shield member of a cable for shielding electromagnetic noise to a metallic cabinet mounted on a vehicle, comprising:
    a terminal made entirely of metal and adapted to be directly connected to the shield member by a caulking connection;
    a fixing member for fixing the terminal directly onto the metallic cabinet;
    wherein:
        only the terminal is installed between the shield member and the metallic cabinet, and
        connection is made such that electric resistance between the shield member and the metallic cabinet is equal to or less than 10 mΩ.

2. The shield connection structure according to claim 1, the electric resistance between the shield member and the metallic cabinet is equal to or less than 1 mΩ.

3. The shield connection structure according to claim 2, wherein the terminal comprises a cylindrical part for connecting to the shield member and a flange for fixing to the metallic cabinet.

4. The shield connection structure according to claim 3, wherein the connection between the cylindrical part of the terminal and the shield member is a caulking connection wherein the shield member is sandwiched between a caulking member and the cylindrical part.

5. The shield connection structure according to claim 2, wherein the terminal is subjected to a corrosion-proofing processing.

6. The shield connection structure according to claim 2, wherein the fixing member is a member for fixing the terminal to the metallic cabinet in a removable manner.

7. The shield connection structure according to claim 2, wherein the metallic cabinet is a cabinet of a device to be mounted on a vehicle.

8. The shield connection structure according to claim 1, wherein the terminal comprises a cylindrical part for connecting to the shield member and a flange for fixing to the metallic cabinet.

9. The shield connection structure according to claim 8, wherein the connection between the cylindrical part of the terminal and the shield member is a caulking connection wherein the shield member is sandwiched between a caulking member and the cylindrical part.

10. The shield connection structure according to claim 1, wherein the terminal is subjected to a corrosion-proofing processing.

11. The shield connection structure according to claim 1, wherein the fixing member is a member for fixing the terminal to the metallic cabinet in a removable manner.

12. The shield connection structure according to claim 1, wherein the metallic cabinet is a cabinet of a device to be mounted on a vehicle.

13. The shield connection structure according to claim 1, wherein the terminal comprises a cylindrical part for connecting to the shield member and a flange for fixing to the metallic cabinet.

14. The shield connection structure according to claim 13, wherein the connection between the cylindrical part of the terminal and the shield member is a caulking connection wherein the shield member is sandwiched between a caulking member and the cylindrical part.

15. The shield connection structure according to claim 1, wherein the terminal is subjected to a corrosion-proofing processing.

16. The shield connection structure according to claim 1, wherein the fixing member is a member for fixing the terminal to the metallic cabinet in a removable manner.

* * * * *